United States Patent
Sun

(10) Patent No.: US 7,177,152 B1
(45) Date of Patent: Feb. 13, 2007

(54) COLLECTIVE AND RESTRICTIVE INHALANT AND RADIATING DEVICE FOR APPLIANCES

(76) Inventor: Yuan-Hsin Sun, P.O. Box 697, Fongyuan City, Taichung County (TW) 420

( * ) Notice: Subject to any disclaimer, the term of this patent is extended or adjusted under 35 U.S.C. 154(b) by 274 days.

(21) Appl. No.: 11/011,127

(22) Filed: Dec. 15, 2004

(51) Int. Cl.
*H05K 7/20* (2006.01)
*F28D 15/00* (2006.01)
*F25B 21/02* (2006.01)

(52) U.S. Cl. .................. 361/697; 62/3.2; 165/104.33; 361/700

(58) Field of Classification Search ............. 62/3.2; 165/104.33; 361/697, 700
See application file for complete search history.

(56) References Cited

U.S. PATENT DOCUMENTS

| | | | |
|---|---|---|---|
| 5,374,944 A * | 12/1994 | Janosky et al. | 347/223 |
| 5,655,375 A * | 8/1997 | Ju | 62/3.6 |
| 6,181,556 B1 * | 1/2001 | Allman | 361/690 |
| 6,415,612 B1 * | 7/2002 | Pokharna et al. | 62/3.2 |
| 6,646,874 B2 * | 11/2003 | Pokharna et al. | 361/687 |
| 6,779,595 B1 * | 8/2004 | Chiang | 165/104.33 |
| 6,795,316 B2 * | 9/2004 | Owens et al. | 361/704 |
| 6,880,346 B1 * | 4/2005 | Tseng et al. | 62/3.7 |
| 6,917,522 B1 * | 7/2005 | Erturk et al. | 361/700 |
| 7,019,974 B2 * | 3/2006 | Lee et al. | 361/700 |

* cited by examiner

Primary Examiner—Greg Thompson

(57) ABSTRACT

A collective and restrictive inhalant and radiating device for appliances includes a heat inhaler in a CPU of a computer or other electric appliances, a first heat radiation block connected to the heat inhaler by a pair of first thermic pipes, a second heat radiation block engaged with the left side of the first heat radiation block having a TE modules on left side and an inlaid concave in underside engaged on a horizontal portion of a U-shaped condensation inhaler, a third heat radiation block connected to a fourth heat radiation block by a pair of second thermic pipe and disposed in the condensation inhaler and engaged with a heating surface of the TE modules. Each of the heat radiation blocks has an electric fan on the top or on a lateral side for blowing in or exhausting out the hot air from the blocks.

5 Claims, 3 Drawing Sheets

COLLECTIVE AND RESTRICTIVE INHALANT AND RADIATING DEVICE FOR APPLIANCES

BACKGROUND OF THE INVENTION

The present invention relates to heat radiation apparatus and more particularly to a collective and restrictive inhalant and radiating device for appliances which has the extreme heat radiation effect by adoption of the superconductive tube and the thermoelectric cooling modules in cooperation with several heat radiating blocks.

As we know that the computer manufacturers, for keeping the durability of the electronic parts such a the central processing unit (CPU), the source controlling device and the other electric appliances in the computer utilize a set of the radiation fins in combination with an electric fan installed above the CPU which usually creates high temperature. The CPU of the old-fashioned computer has low speed processing capability that creates medial high temperature. So this type of heat radiation device is capable of radiating the heat in the CPU and keeps the CPU processed at an appropriate temperature. Nowadays, the new style computers developed by the manufacturers around world have the processing speed becoming more and more swift. The calculation speed of the CPU is over 2.8 GHZ and even 3.2 GHZ and possesses 64 Kbits. In facing the future progressive tendency, the manufacturers have to make diligent effort in research and development for a new heat radiation device to cope with this requirement. However, most of them intend to improve the radiating fins and the electric fan. The new products in the market are basically no much difference with each other and have no great breaking through on the radiation efficiency. So as the electric appliances, the power control device as well as the apparatus.

SUMMARY OF THE PRESENT INVENTION

The present invention has a principal object to provide a collective and restrictive inhalant and radiating device for appliances which device aims to promote radiation efficiency for the electric appliances and the CPU in a computer which have a high speed heat radiation capacity and can be able to process normally.

Accordingly, the collective and restrictive inhalant and radiating device for appliances of the present invention comprises generally:

a heat inhaler installed to a heat source spot of an appliances and/or a CPU of a computer;

at least a thermic pipe connected the heat inhaler and a first radiation block which has a plurality of radiating fins and exhausts hot air with a first electric fan. Then juxtaposedly engaged with a second radiation block which has also a plurality of radiating fins and exhausts the hot air with a second electric fan and then has a lateral side contact a thermoelectric cooling modules (TE modules) which has a thermoelectric cooling surface attached to the second radiation block to create the cooling source and a thermoelectric heating surface attached to a third radiation block to create hot air.

The third radiation block has also a plurality of radiating fins and exhausts the hot air with a third electric fan.

The flexible pipe transfers the hot source from the heat inhaler to the first and second radiation blocks to perform heat radiating activity. The TE modules reduces the temperature in the second radiation block and the hot air created on its thermoelectric heating surface is simultaneously exhausted by a third and a fourth radiation block. So as to achieve a quick effective radiation system.

The present invention will become more fully understood by reference to the following detailed description thereof when read in conjunction with the attached drawings.

DETAILED DESCRIPTION OF THE PREFERRED EMBODIMENT

Figure 1:
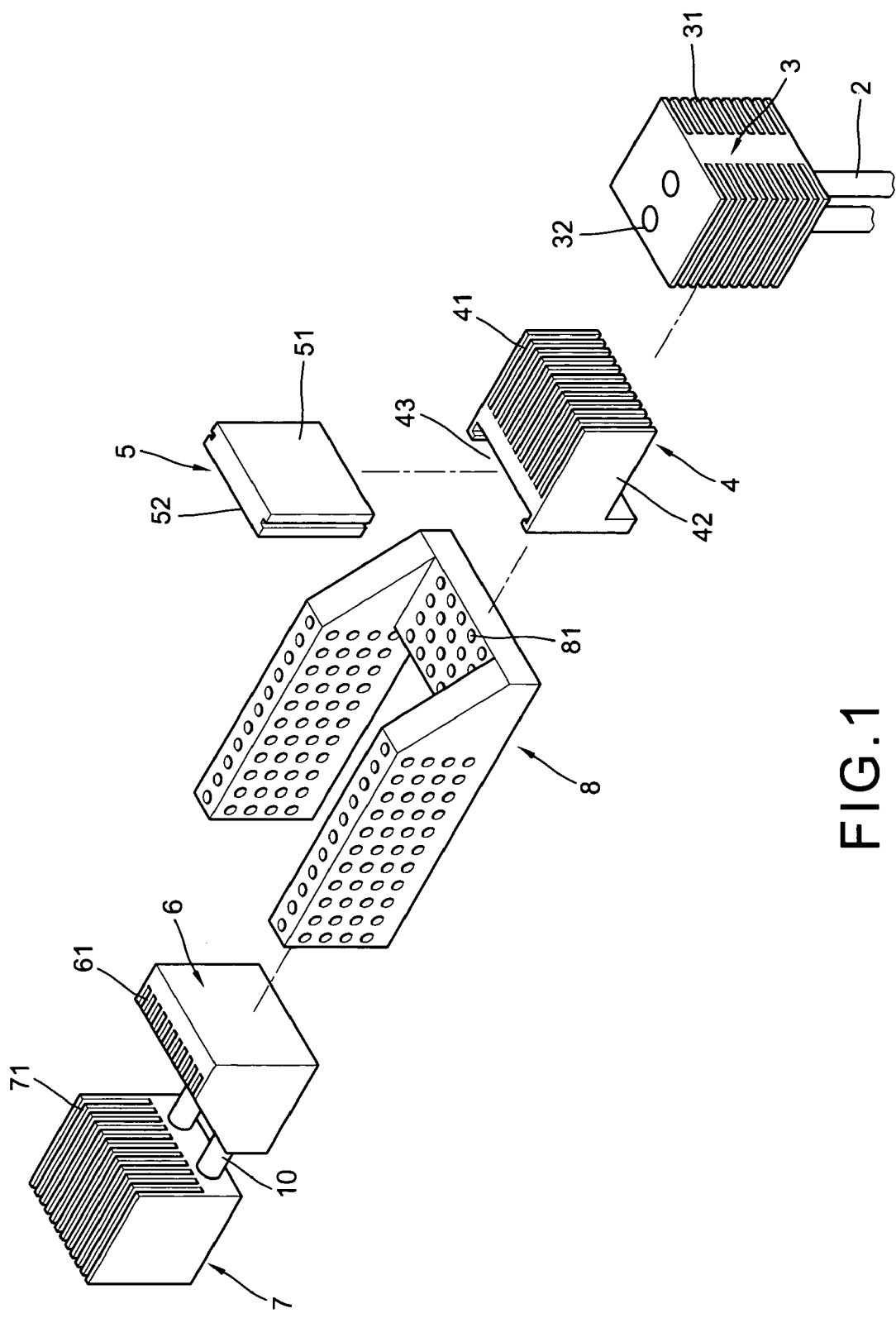
FIG. 1 is an exploded perspective view to show the preferred embodiment of the present invention.
Figure 2:
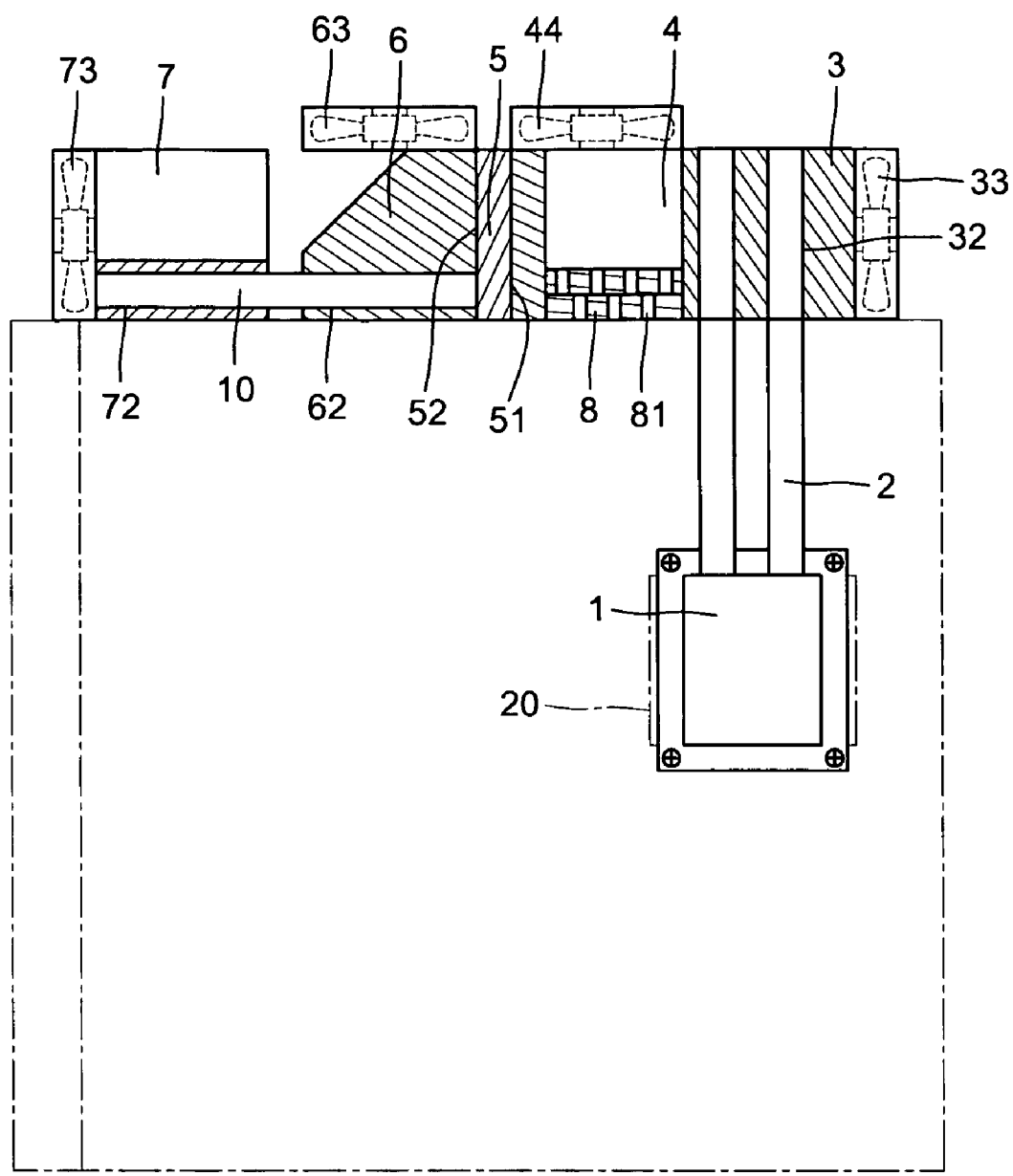
FIG. 2 is a sectional view to show the assembly of FIG. 1.
Figure 3:
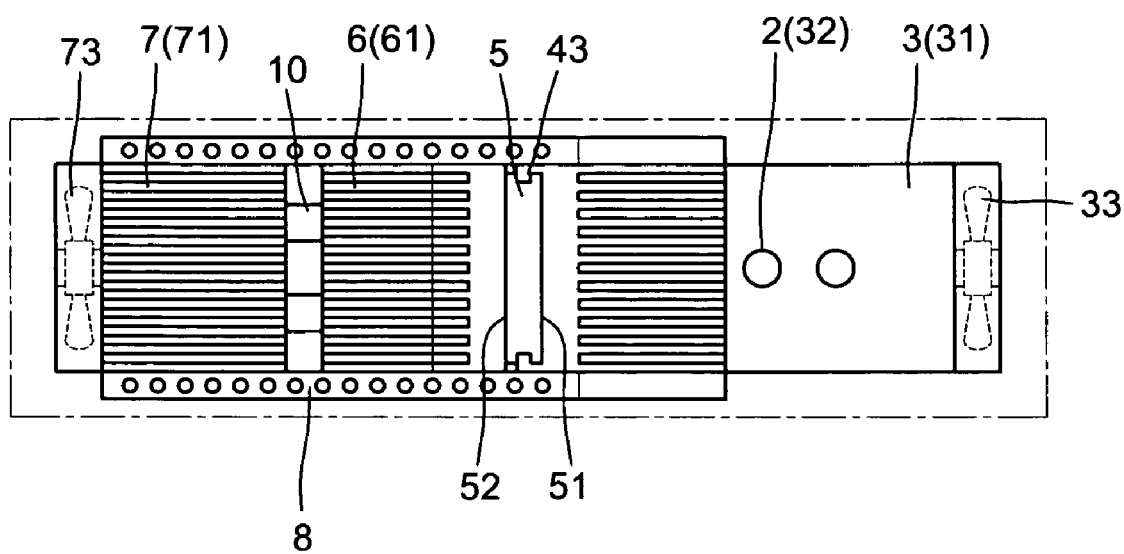
FIG. 3 is a top view of FIG. 2.

With reference to FIGS. 1, 2 and 3, the collective and respective inhalant and radiating device for appliances of the present invention comprises a heat inhaler 1 disposed in a central processing unit (CPU) 20 of a computer or the heat source radiation spot of an electric appliance and connected to a first heat radiation block 3 by a pair of thermic pipes 2 thebetween, the first heat radiation block 3 having a plurality of horizontal radiating fins 31 spacedly superimposed around four sides and a first electric fan 33 in right side for exhausting the hot air out of the block 3 and pair of vertical through holes 32 for respectively angage the upper end of the thermic pipes which are made of copper aluminum or other suitable metal in which there are full of high speed heat conductive special powdered metallic medium or the liquidized medium (for high temperature thermic pipe such as the yttrium or the barium metallic powder) and other heat superconductive material (for medial temperature thermic pipe such as the Ammonia). The principle in that the particles of these chemical materials will create high vaporization effect after received the calorific valve and flow back after reached to the condensation section of the pipes 2 so as to cause the heat source conducting swiftly in the state of fluctuations. So called as the thermic pipe because it has the conductive speed higher than the conventional metallic bar or the radiating fans for about several folds or even more than ten folds. Due to its high speed conductive character, the thermic pipe 2 is capable of absorbing heat source as well as the heat energy in the heat inhaler 1 and rapidly transferring to the first radiation block 3, a second heat radiation block 4 engaged with the left side of the first radiation block having a plurality of vertical radiating fins 41 spacedly formed on right side engaged with the left side of the first heat radiation block 3, a vertical receiving space 43 in the left side for slidably receiving a TE modules 5 which includes a cooling surface 51 toward inside and a heating surface 52 toward outside, an inlaid concave 42 in underside for inlaying the second heat radiation block 4 onto a horizontal potion of a roughly U-shaped condensation inhaler 8 which is made of multi-layer wooden material has a pair inclined side walls above the horizontal portion and a plurality of alignments of through holes 81 regularly arranged in the entire body, a third heat radiation block 6 having a right side engaged with the heating surface 52 of the TE modules 5, a plurality of radiating fins 61 spacedly formed on an inclined left side and a pair of first horizontal through hole spacedly formed above the bottom for inserting one end of a pair of thermic pipes 10 which have their other ends inserted into a pair of through holes 72 of a fourth heat radiation block 7 which has a plurality of vertical radiating fins 71 spacedly arranged on the top and a fourth electric fan 73 on left side, wherein the heat second radiation block 4 further has a second electric fan 44 and the third heat radiation block 6 further has a third electric fan 63 on their tops, both of the electric fans 33, 44, 63 and 73 are functioned to exhaust the hot air out of these radiation blocks 3, 4, 6 and 7. Due to the combination of the first and second heat radiation blocks 3 and 4 in addition to the TE modules 5, a low temperature frozen structure is therefore formed to quickly lower the temperature of the hot source transferred by the thermic pipes 2 from the heat inhaler 1 and swiftly obtained the cooling and radiation effect because the cooling surface 51 of the TE modules 5 creates the cooling source and its heating surface 52 creates high temperature thermo-energy after connecting to a power source. Further, the third heat radiation block 6 is disposed into the condensation inhaler 8 and engaged with the two lateral walls thereof. The condensation inhaler 8 is provided to absorb the moisture and discharge the liquidized frozen moisture.

In operation, the thermic pipes 2 transfers the heat source from the heat inhaler 1 to the first and second heat radiation blocks 3 and 4 and the cooling surface 51 of the TE modules 5 lowers the temperature in the first and second heat radiation blocks 3 and 4. Then the second electric fan 44 blows the air into the second heat radiation block 4 and the first electric fan 33 exhausts the hot air so as to perform a first temperature reduction and radiation activity. Simultaneously the hot air created by the heating surface 52 of the TE modules 5 is blown by the third electric fan 63 into the third heat radiation block 6 and exhausted by the fourth electric fan 73 of the fourth heat radiation block 7 so as to perform second temperature reduction and radiation activity. The frozen moisture in the condensation inhaler 8 is discharged in accompanied with the rotation of the electric fans 32, 44, 63 and 73 for quickly cooling and radiating the heat in the appliances and especially in the CPU 20 of a computer.

The thermic pipes 2 is long and flexible. So it can be freely bent over to facilitate the components of the heat radiating device to attach the inner wall and/or outer wall of the housing of the computer. If they are attached to the outer wall in order to prevent the dirt from contaminating the inside of the housing. Besides, this radiating device is suitable to the computers either of the prone type or of the upright type.

Note that the specification relating to the above embodiment should be construed as an exemplary rather than as a limitative of the present invention, with many variations and modifications being readily attainable by a person of average skill in the art without departing from the spirit or scope thereof as defined by the appended claims and their legal equivalents.

I claim:

1. A collective and restrictive inhalant and radiating device for appliance comprising:

a heat inhaler disposed on a central processing unit (CPU) of a computer;

a first heat radiation block having a plurality of horizontal radiating fins spacedly superimposed around four sides, a pair of vertical through holes spacedly formed therein and a first electric fan disposed on a right side thereof;

a pair of first thermic pipes having upper ends respectively engaged with the vertical through holes of said first heat radiation block and lower ends engaged with said heat inhaler;

a second heat radiation block having a plurality of vertical radiating fins spacedly arranged on right side thereof engaged with a left side of said first heat radiation block, a vertical receiving space in a left side for receiving a TE modules which has a cooling surface toward inside and a heating surface toward outside, a second electric fan on top and an inlaid concave in underside thereof;

a U-shaped condensation inhaler having a horizontal portion engaged with the inlaid concave of said second heat radiation block, a pair of inclined side walls above the horizontal portion and a plurality alignment of through holes spacedly and regularly arranged in entire body thereof;

a third heat radiation block disposed into said condensation inhaler having two lateral sides engaged with the side walls of said condensation inhaler, a right side engaged with the heating surface of said TE module, a plurality of vertical radiating fins spacedly arranged on an inclined portion of a left side, a third electric fan on top and a pair of first horizontal through holes spacedly formed above bottom thereof;

a fourth heat radiation block having a plurality of vertical radiating fins spacedly arranged on upper portion, a pair of second horizontal through holes spacedly formed above bottom engageable with the first horizontal through holes of said third heat radiation block and connected by a pair of second thermic pipes therebetween and a fourth electric fan on a left said thereof;

whereby, said radiating device may attach to inside and/or outside of a main housing of the computer.

2. The radiating device as recited in claim 1, wherein said device is suitable to other appliances.

3. The radiating device as recited in claim 1, wherein said thermic pipes are made of copper or aluminum material and are long and flexible.

4. The radiating device as recited in claim 3, wherein said thermic pipe are full of high speed conductive special powered metallic medium or liquidized medium of yttrium or barium if the pipes are high temperature thermic pipes and Ammonia if the pipes are medial temperature thermic.

5. The radiating device as recited in claim 1, wherein said U-shaped condensation inhaler is made of multi-layer wooden material.

* * * * *